United States Patent
Ogino

(10) Patent No.: US 10,325,762 B2
(45) Date of Patent: Jun. 18, 2019

(54) SPUTTERING TARGET FOR FORMING MAGNETIC RECORDING FILM AND PROCESS FOR PRODUCING SAME

(71) Applicant: JX Nippon Mining & Metals Corporation, Tokyo (JP)

(72) Inventor: Shin-ichi Ogino, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 314 days.

(21) Appl. No.: 14/384,184

(22) PCT Filed: Jul. 10, 2013

(86) PCT No.: PCT/JP2013/068867
§ 371 (c)(1),
(2) Date: Sep. 10, 2014

(87) PCT Pub. No.: WO2014/013920
PCT Pub. Date: Jan. 23, 2014

(65) Prior Publication Data
US 2015/0060268 A1    Mar. 5, 2015

(30) Foreign Application Priority Data

Jul. 20, 2012   (JP) .................................. 2012-161563

(51) Int. Cl.
*H01J 37/34* (2006.01)
*C23C 14/34* (2006.01)
(Continued)

(52) U.S. Cl.
CPC ........ *H01J 37/3429* (2013.01); *B22F 1/0081* (2013.01); *B22F 3/14* (2013.01);
(Continued)

(58) Field of Classification Search
CPC .............. C23C 14/3414; H01J 37/3426; H01J 37/3429; B22F 1/0081; B22F 3/14;
(Continued)

(56) References Cited

U.S. PATENT DOCUMENTS

| | | | |
|---|---|---|---|
| 7,081,303 | B2 | 7/2006 | Yasui et al. |
| 7,909,949 | B2 | 3/2011 | Nakamura et al. |

(Continued)

FOREIGN PATENT DOCUMENTS

| | | | |
|---|---|---|---|
| JP | 2000-306228 A | 11/2000 | |
| JP | 2000-311329 A | 11/2000 | |

(Continued)

OTHER PUBLICATIONS

Pincemin, S., Olives, R., Py, X., Christ, M. Highly conductive composites made of phase change materials and graphite for thermal storage, France, 2008, Solar Energy Materials & Solar Cells 92 (2008), p. 603-613 [online] [Accessed on Aug. 9, 2018] (Year: 2008).*

*Primary Examiner* — Michael A Band
(74) *Attorney, Agent, or Firm* — Howson & Howson LLP

(57) ABSTRACT

A C-containing FePt-based sputtering target for forming a magnetic recording film, wherein a ratio of an X-ray diffraction peak intensity of a graphite (002) plane in a cross section perpendicular to a sputtering surface relative to an X-ray diffraction peak intensity of a graphite (002) plane in a plane horizontal to a sputtering surface is 2 or more. A magnetic recording layer is configured from a magnetic phase such as an Fe—Pt alloy and a nonmagnetic phase that separates the magnetic phase, and the sputtering target is a ferromagnetic material sputtering target in which carbon is used as a nonmagnetic phase material. When sputtered, the ferromagnetic material sputtering target is effective in preventing the generation of particles caused by an abnormal discharge originating from carbon, which is prone to aggregate.

6 Claims, 8 Drawing Sheets

(51) Int. Cl.
  *C22C 32/00* (2006.01)
  *C22C 33/02* (2006.01)
  *B22F 1/00* (2006.01)
  *B22F 3/14* (2006.01)
  *G11B 5/851* (2006.01)
  *G11B 5/65* (2006.01)
(52) U.S. Cl.
  CPC .......... *C22C 32/00* (2013.01); *C22C 33/0278* (2013.01); *C23C 14/3414* (2013.01); *G11B 5/653* (2013.01); *G11B 5/851* (2013.01)
(58) Field of Classification Search
  CPC ..... C22C 33/0278; C22C 32/00; G11B 5/851; G11B 5/653
  See application file for complete search history.

(56) References Cited

U.S. PATENT DOCUMENTS

| | | | |
|---|---|---|---|
| 8,663,402 B2 | 3/2014 | Nakamura et al. | |
| 2005/0196649 A1 | 9/2005 | Inamura et al. | |
| 2007/0189916 A1 | 8/2007 | Zhang | |
| 2008/0057350 A1 | 3/2008 | Das et al. | |
| 2009/0242393 A1 | 10/2009 | Satoh | |
| 2010/0074835 A1* | 3/2010 | Mercuri | B82Y 30/00 423/448 |
| 2011/0048935 A1 | 3/2011 | Koide | |
| 2011/0162971 A1 | 7/2011 | Nakamura et al. | |
| 2012/0241316 A1 | 9/2012 | Arakawa | |
| 2012/0273347 A1 | 11/2012 | Koide | |
| 2012/0300600 A1 | 11/2012 | Kanbe et al. | |
| 2013/0168240 A1 | 7/2013 | Ogino et al. | |
| 2013/0213803 A1* | 8/2013 | Sato | B22F 3/14 204/298.13 |
| 2013/0248362 A1 | 9/2013 | Ogino et al. | |
| 2013/0292245 A1 | 11/2013 | Ikeda et al. | |
| 2013/0306470 A1 | 11/2013 | Ogino et al. | |
| 2014/0083847 A1 | 3/2014 | Sato | |
| 2014/0231250 A1 | 8/2014 | Ogino et al. | |
| 2014/0360871 A1 | 12/2014 | Sato et al. | |

FOREIGN PATENT DOCUMENTS

| | | | |
|---|---|---|---|
| JP | 2003-313659 A | 11/2003 | |
| JP | 2011-208265 A | 10/2011 | |
| JP | 2012-102387 A | 5/2012 | |
| WO | 2012/073879 A1 | 6/2012 | |
| WO | WO 2012086335 A1 * | 6/2012 | ................ B22F 3/14 |

\* cited by examiner

[Fig. 1]
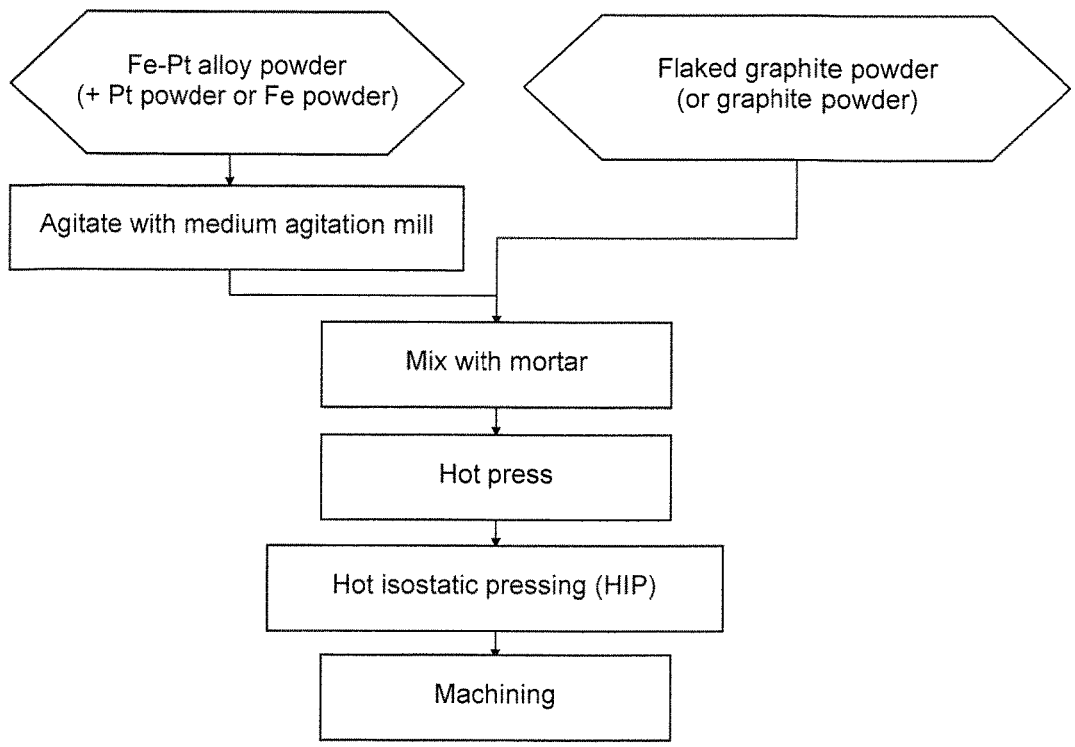
[Fig. 2]
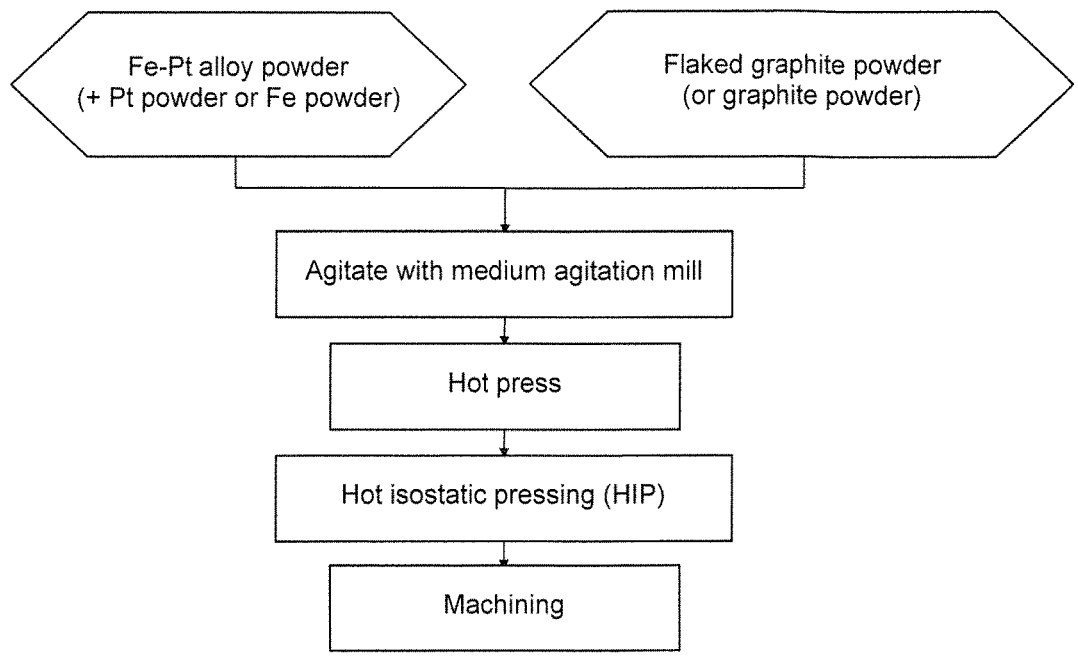

[Fig. 3]
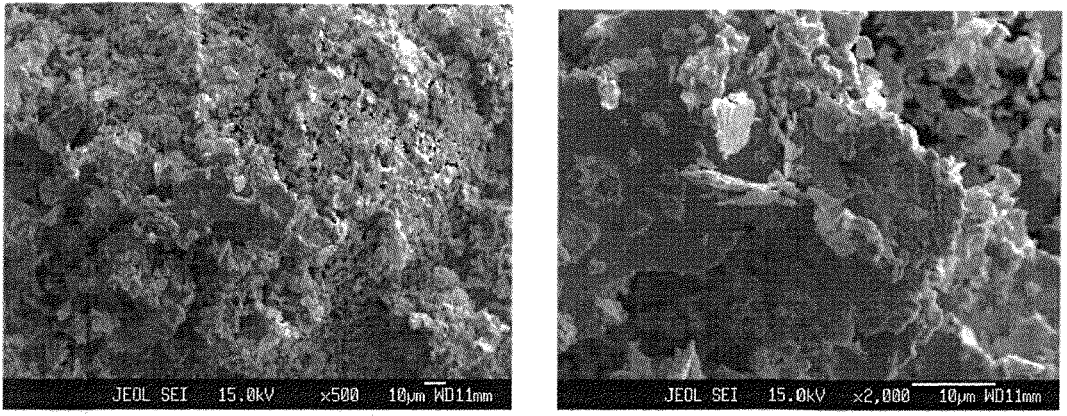
[Fig. 4]
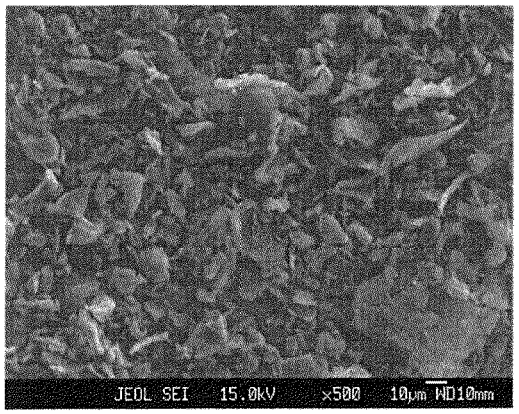
[Fig. 5]
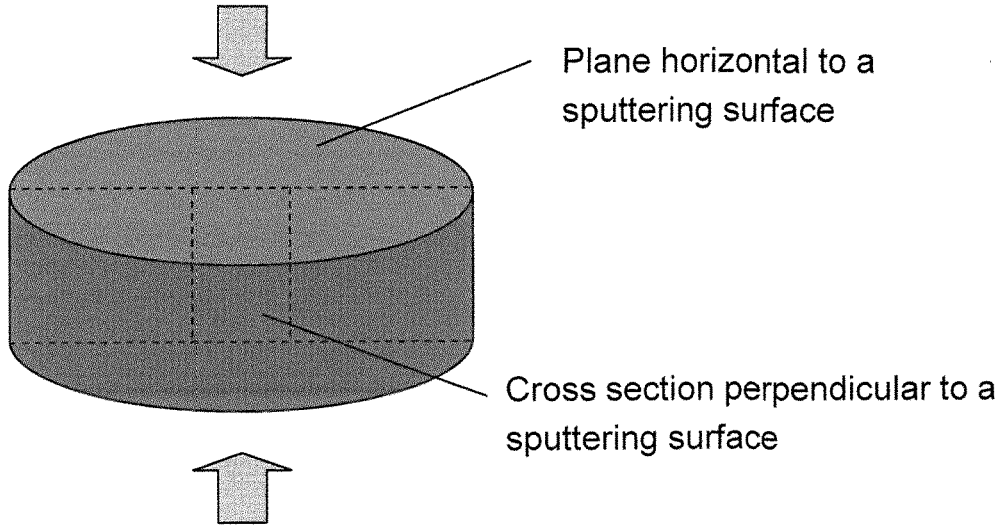

[Fig. 6]
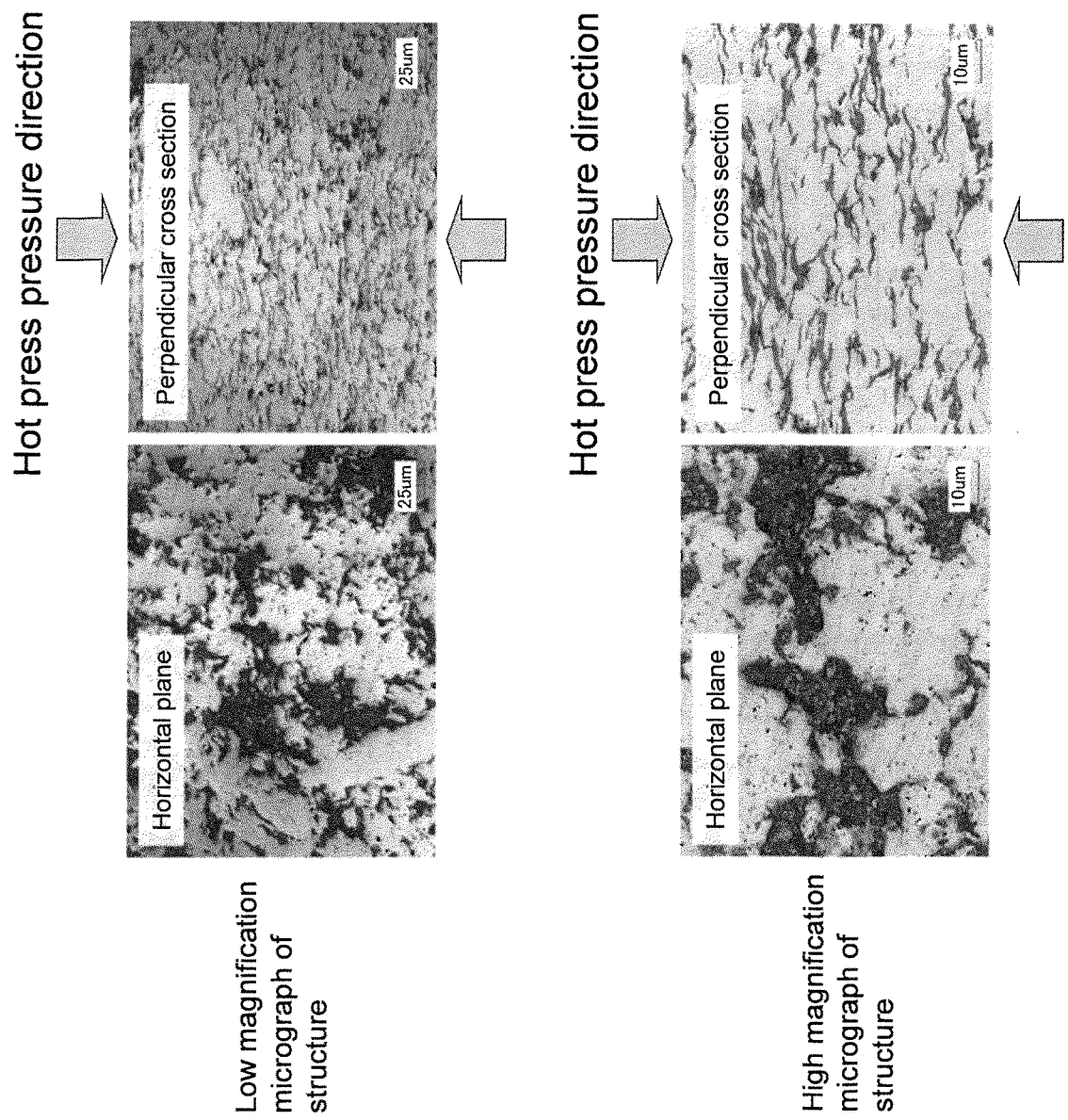

[Fig. 7]
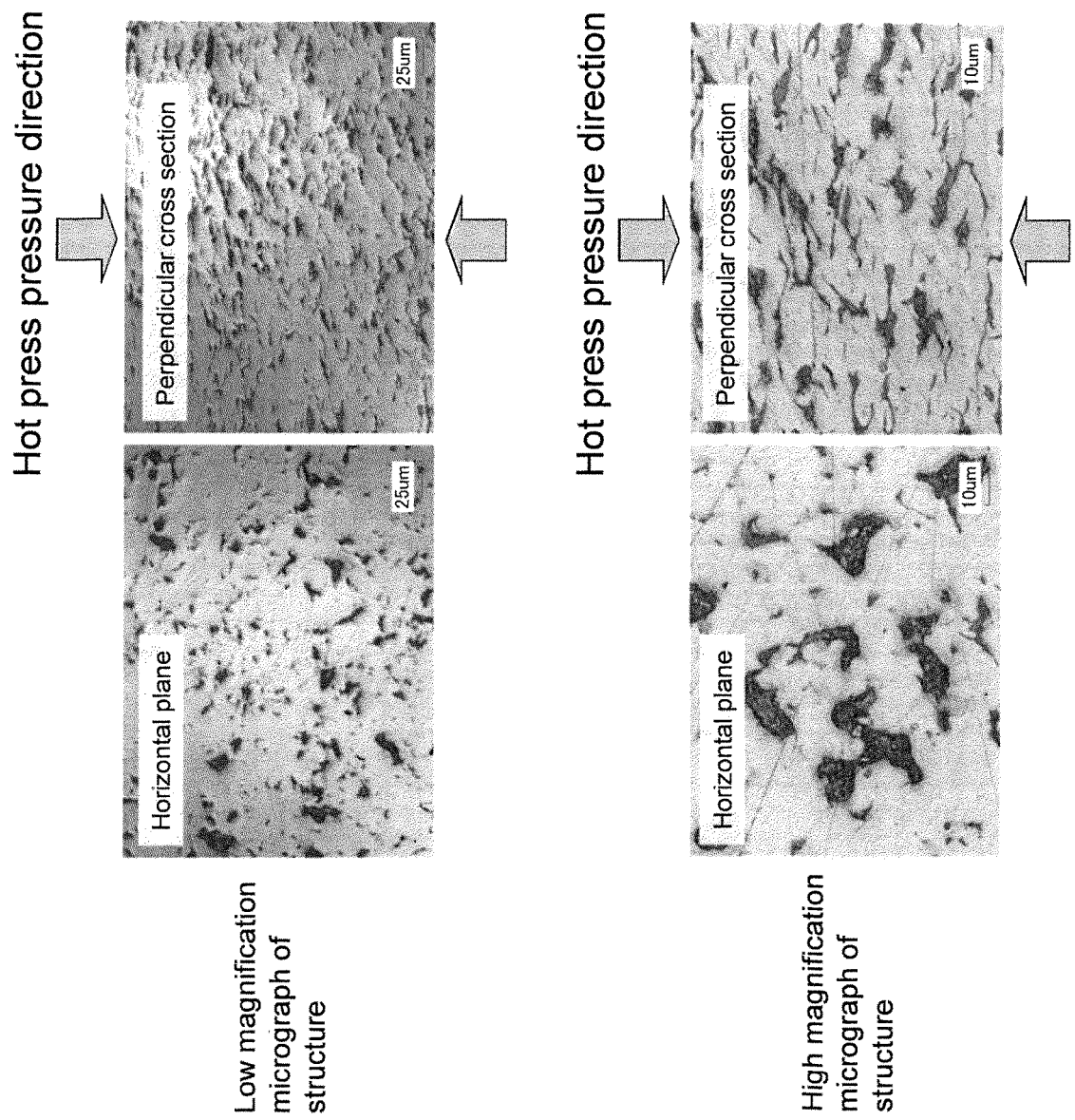

FIG. 8
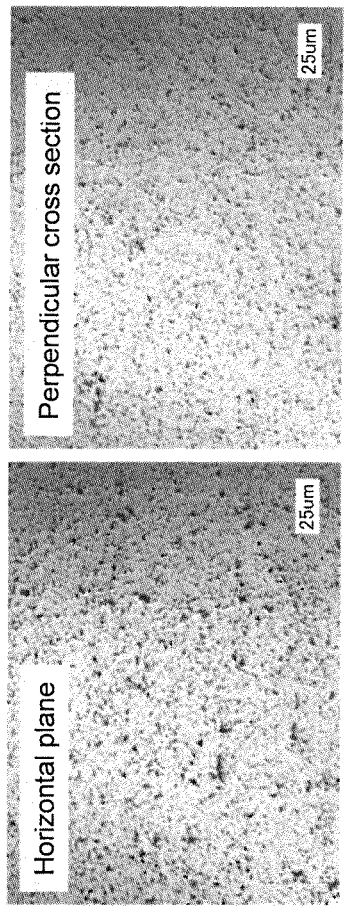
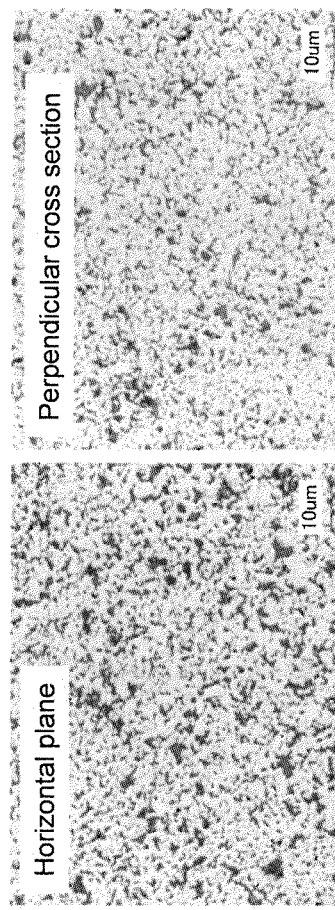
Low magnification micrograph of structure
High magnification micrograph of structure

SPUTTERING TARGET FOR FORMING MAGNETIC RECORDING FILM AND PROCESS FOR PRODUCING SAME

BACKGROUND

The present invention relates to a ferromagnetic material sputtering target that is used for the deposition of a magnetic thin film of a magnetic recording media, particularly for the deposition of a magnetic recording layer of a thermally-assisted magnetic recording media, and to an FePt-based ferromagnetic material sputtering target capable of achieving a stable discharge and reducing the generation of particles when sputtered with a magnetron sputtering equipment.

In the field of magnetic recording media as represented with HDD (hard disk drives), a material based on Co, Fe or Ni as ferromagnetic metals is used as the material of the magnetic thin film which is used for the recording. For example, Co—Cr-based or Co—Cr—Pt-based ferromagnetic alloys with Co as its main component are used for the recording layer of hard disks adopting the longitudinal magnetic recording system. Moreover, composite materials of Co—Cr—Pt-based ferromagnetic alloys with Co as its main component and nonmagnetic inorganic grains are often used for the recording layer of hard disks adopting the vertical magnetic recording system which was recently put into practical application. In addition, a magnetic thin film of a magnetic recording medium such as a hard disk is often produced by sputtering a ferromagnetic material sputtering target having the foregoing materials as its components in light of its high productivity.

Meanwhile, the recording density of magnetic recording media is rapidly increasing year by year, and the current surface density of 100 Gbit/in$^2$ is expected to reach 1 Tbit/in$^2$ in the future. When the recording density reaches 1 Tbit/in$^2$, the size of the recording bit will fall below 10 nm and, in such a case, it is anticipated that the superparamagnetization caused by thermal fluctuation will become a problem, and it is further anticipated that the currently used magnetic recording medium; for instance, a material with higher magnetic crystalline anisotropy obtained by adding Pt to a Co—Cr-based alloy, or a medium in which B is further added to the foregoing material to attenuate the magnetic coupling between the magnetic grains, will no longer be sufficient. This is because, for grains to stably behave ferromagnetically at a size of 10 nm or less, the grains need to possess even higher magnetic crystalline anisotropy.

In light of the above, an FePt phase having an $L1_0$ structure is attracting attention as a material for use in an ultrahigh density recording medium. Moreover, since an FePt phase having a $L1_0$ structure yields superior corrosion resistance and oxidation resistance, it is expected to become a material that can be suitably applied as a recording medium. The FePt phase has an order-disorder transformation point at 1573 K, and has a $L1_0$ structure even when an alloy is hardened from a high temperature due to the rapid ordered reaction. Furthermore, in connection with using the FePt phase as a material for use in an ultrahigh density recording medium, demanded is the development of technology for dispersing the ordered FePt grains, in a magnetically separated state, while densely aligning the orientation thereof as much as possible.

In light of the foregoing circumstances, a magnetic thin film having a granular structure in which the FePt magnetic grains having an $L1_0$ structure are magnetically separated from each other through the interposition of nonmagnetic materials such as carbon is being proposed for use in a magnetic recording medium of next-generation hard disks adopting the thermally-assisted magnetic recording system. This magnetic thin film having a granular structure has a structure in which the magnetic grains are magnetically insulated through the interposition of nonmagnetic substances. Documents related to granular-type magnetic recording media and other related publications include, for example, Patent Document 1, Patent Document 2, Patent Document 3, Patent Document 4, Patent Document 5, Patent Document 6, and Patent Document 7 listed below.

The foregoing magnetic recording layer is configured from a magnetic phase such as an Fe—Pt alloy and a nonmagnetic phase that separates the magnetic phase, and carbon is effective as the nonmagnetic phase material. While this kind of magnetic recording layer is normally formed via the sputter deposition method, a ferromagnetic material sputtering target containing carbon entails the following problems; namely, carbon is prone to aggregate, the target is difficult to be sintered and, when sputtered with a magnetron sputtering equipment, causes an abnormal discharge during sputtering, and thereby generates particles (contaminants that adhere to the substrate).

Patent Document 1: JP 2000-306228 A
Patent Document 2: JP 2000-311329 A
Patent Document 3: JP 2008-59733 A
Patent Document 4: JP 2008-169464 A
Patent Document 5: JP 2012-102387 A
Patent Document 6: JP 2011-208265 A
Patent Document 7: International Publication No. WO/2012/086335

SUMMARY

The foregoing magnetic recording layer is configured from a magnetic phase such as an FePt-based alloy and a nonmagnetic phase that separates the magnetic phase, and an object of this invention is to provide is a ferromagnetic material sputtering target in which carbon (C) is used as a nonmagnetic phase material and, when sputtered, is effective in preventing the generation of particles caused by an abnormal discharge originating from carbon, which is prone to aggregate.

In order to achieve the foregoing object, as a result of intense study, the present inventors discovered that stable sputtering is enabled and abnormal discharge can be inhibited when a flat or tabular C phase is dispersed in a manner of being aligned in a specified direction. In other words, the present inventors discovered that the abnormal discharge that occurs during sputtering can be inhibited and the generation of particles can be reduced by improving the dispersion state of the C phase in the target.

Based on the foregoing discovery, the present invention provides:
1) A C-containing FePt-based sputtering target for forming a magnetic recording film, wherein a ratio (X/Y) of an X-ray diffraction peak intensity of a graphite (002) plane in a cross section horizontal to a sputtering surface (X) relative to an X-ray diffraction peak intensity of a graphite (002) plane in a plane perpendicular to a sputtering surface (Y) is 2 or more; 2) The sputtering target according to 1) above, wherein a ratio ($Y_{001}/Y_{100}$) of an X-ray diffraction peak intensity of an Fe—Pt alloy (001) plane in a cross section perpendicular to a sputtering surface ($Y_{001}$) relative to an X-ray diffraction peak intensity of an Fe—Pt alloy (100) plane in a cross section perpendicular to a sputtering surface ($Y_{100}$) is 1.0 or less, and a ratio ($X_{001}/X_{100}$) of an X-ray diffraction peak intensity of an Fe—Pt alloy (001) plane in a plane horizontal to a sputtering surface ($X_{001}$) relative to an X-ray diffraction peak intensity of an Fe—Pt alloy (100) plane in a plane horizontal to a sputtering surface ($X_{100}$) is 1.0 or more; 3) The sputtering target according to 1) or 2) above, wherein an average thickness of a C phase in a cross section perpendicular to a sputtering surface is 10 μm or less; 4) The sputtering target according to any one of 1) to 3) above, wherein a Pt content is 5 mol % or more and 60 mol % or less; 5) The sputtering target according to any one of 1) to 4) above, wherein a C content is 10 mol % or more and 70 mol % or less; 6) The sputtering target according to any one of 1) to 5) above, wherein the sputtering target contains, as an additive element, one or more elements selected from a group consisting of B, Ru, Ag, Au, and Cu in an amount of 0.5 mol % or more and 10 mol % or less; and 7) The sputtering target according to any one of 1) to 6) above, wherein the sputtering target contains, as an additive element, one or more inorganic substance materials selected from a group consisting of oxides, nitrides, carbides, and carbonitrides.

The present invention additionally provides:
8) A method for manufacturing the sputtering target according to any one of 1) to 7) above, wherein flat or tabular raw material powders are subject to pulverization and mixing and thereafter compacted, and an obtained compact is subject to uniaxial pressure sintering.

The foregoing magnetic recording layer is configured from a magnetic phase such as an Fe—Pt alloy and a nonmagnetic phase that separates the magnetic phase, and the foregoing sputtering target is a ferromagnetic material sputtering target in which carbon is used as a nonmagnetic phase material. The ferromagnetic material sputtering target of the present invention yields superior effects in that, when sputtered, the ferromagnetic material sputtering target is effective in preventing the generation of particles caused by an abnormal discharge originating from carbon, which is prone to aggregate.

In addition, the present invention yields an effect of being able to efficiently deposit a magnetic thin film, particularly a granular-type magnetic recording layer, of a magnetic recording medium.

BRIEF DESCRIPTION OF DRAWINGS

FIG. 1 This is an example of the manufacturing method of the sputtering target according to the present invention.

FIG. 2 This is an example of the manufacturing method of the sputtering target according to the present invention.

FIG. 3 This is an SEM micrograph of the Fe—Pt alloy powder that was subject to flattening.

FIG. 4 This is an SEM micrograph of the flaked graphite as the raw material powder.

FIG. 5 This is a schematic diagram illustrating the plane horizontal to the sputtering surface and the cross section perpendicular to the sputtering surface.

FIG. 6 This is a laser micrograph showing the target structure of Example 1 (plane horizontal to a sputtering surface: left micrograph; cross section perpendicular to sputtering surface: right micrograph).

FIG. 7 This is a laser micrograph showing the target structure of Example 2 (plane horizontal to a sputtering surface: left micrograph; cross section perpendicular to sputtering surface: right micrograph).

FIG. 8 This is a laser micrograph showing the target structure of Comparative Example 1 (plane horizontal to a sputtering surface: left micrograph; cross section perpendicular to sputtering surface: right micrograph).

DETAILED DESCRIPTION

Figure 9:
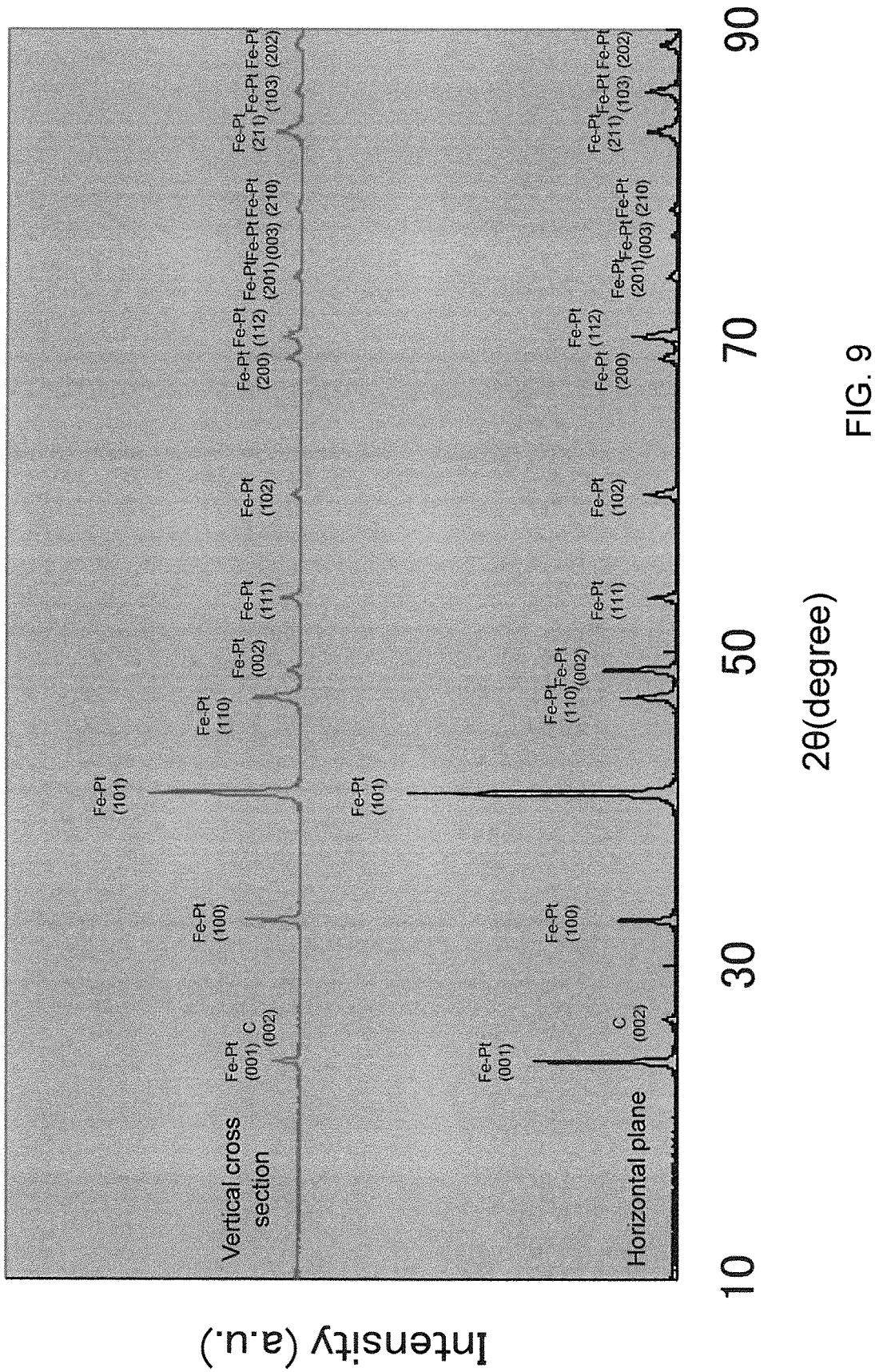
FIG. 9 This shows the ratio of X-ray diffraction peak intensity of the target of Example 1 (plane horizontal to a sputtering surface: lower row; cross section perpendicular to sputtering surface: upper row).

The target of the present invention is able to perform stable sputtering, inhibit abnormal discharge and reduce particle generation as a result of dispersing particles of a C phase as a flat or tabular nonmagnetic material in a manner such that the flat or tabular C phase particles are aligned in a specified direction in a ferromagnetic material made from an Fe—Pt system alloy.

The foregoing the dispersion state of the C phase can be prescribed as follows; namely, in a C-containing FePt-based sputtering target for forming a magnetic recording film, a ratio (X/Y) of an X-ray diffraction peak intensity of a graphite (002) plane in a cross section horizontal to a sputtering surface (X) relative to an X-ray diffraction peak intensity of a graphite (002) plane in a plane perpendicular to a sputtering surface (Y), is 2 or more. Meanwhile, there is no particular limitation regarding the upper limit of the intensity ratio, but preferably the intensity ratio is 15 or less.

Note that FIG. 5 is a schematic diagram illustrating the plane horizontal to a sputtering surface, and the cross section perpendicular to the sputtering surface. The plane horizontal to a sputtering surface corresponds to the surface that is pressed during the hot press.

With the target of the present invention, by using a flat or tabular Fe—Pt system alloy powder in addition to a flat or tabular C powder, the press is performed so that the Fe—Pt system alloy phase is aligned in a specified direction upon pressing the compact that is configured from the foregoing raw material powders and, therefore, the C phase can consequently be dispersed in a manner of being aligned in a specified direction. The foregoing state of the FePt alloy phase can be prescribed as follows; namely, a ratio ($Y_{001}/Y_{100}$) of an X-ray diffraction peak intensity of an Fe—Pt alloy (001) plane in a cross section perpendicular to a sputtering surface ($Y_{001}$) relative to an X-ray diffraction peak intensity of an Fe—Pt alloy (100) plane in a cross section perpendicular to a sputtering surface ($Y_{100}$) is 1.0 or less, and a ratio ($X_{001}/X_{100}$) of an X-ray diffraction peak intensity of an Fe—Pt alloy (001) plane in a plane horizontal to a sputtering surface ($X_{001}$) relative to an X-ray diffraction peak intensity of an Fe—Pt alloy (100) plane in a plane horizontal to a sputtering surface ($X_{100}$) is 1.0 or more.

The C phase is formed by stacking graphene sheets, and has anisotropic electrical conductivity. Thus, when the orientation of the C phase crystals in the sputtering target becomes random, electrical conductivity is affected, and sputtering becomes unstable. This is considered to become a cause of an abnormal discharge. Accordingly, by dispersing a flat or tabular C phase aligned in a specified direction, it is possible to inhibit the abnormal discharge during sputtering and reduce the generation of particles. The flat or tabular C phase can be formed by using a flaked C powder, and an average thickness of the C phase is preferably 1 μm or less.

With the sputtering target of the present invention, preferably, the Pt content is 5 mol % or more and 60 mol % or less, and the remainder is Fe and C. This is because, when the Pt content is less than 5 mol % or exceeds 60 mol %, there are cases where the intended magnetic properties cannot be obtained.

Moreover, with the sputtering target of the present invention, preferably, the C content is 10 mol % or more and 70 mol % or less, and the remainder Fe and Pt. This is because, when the C content is less than 10 mol %, there are cases where the intended magnetic properties cannot be obtained, and when the C content exceeds 70 mol %, C will aggregate and cause the increase in the generation of particles.

Moreover, in order to improve the magnetic properties, the sputtering target of the present invention preferably contains, as an additive element, one or more elements selected from a group consisting of B, Ru, Ag, Au, and Cu in an amount of 0.5 mol % or more and 10 mol % or less. Moreover, by adding, as an additive material, one or more inorganic substance materials selected from a group consisting of oxides, nitrides, carbides, and carbonitrides to the sputtering target of the present invention, it is possible to further improve the magnetic properties.

The sputtering target of the present invention is produced according to the powder metallurgy process shown in FIG. 1 or FIG. 2. Foremost, raw material powders (Fe powder, Pt powder, C powder, and, as needed, powder of an additive metal element and powder of an additive inorganic substance material) are prepared. Here, as the C powder, a flat or tabular graphite or a flaked graphite, i.e. a graphite formed by stacking a small number of graphene sheets, as shown in FIG. 4 is preferably used. In particular, since a flaked graphite yields superior electrical conduction in comparison to a normal graphite, a flaked graphite is especially effective in inhibiting an abnormal discharge and reducing the generation of particles. Moreover, as needed, flat or tabular raw material powders as shown in FIG. 3 obtained by processing Fe powder and Pt powder as metallic constituents are preferably used, the processing being performed by using a ball mill, a medium agitation mill, or the like. It is thereby possible to further align the C phase in a specified direction. The obtained flat or tabular raw material powders to be used preferably have an average thickness of 0.01 μm or more and 20 μm or less.

While a powder of a simple metal material may be used as the Fe powder or the Pt powder, an alloyed powder (Fe—Pt powder) that is alloyed in advance via heat treatment or with an atomizing device may also be used. Moreover, depending on the intended composition, the alloyed Fe—Pt alloy powder may be used by being combined with the Fe powder and/or the Pt powder.

In particular, since an Fe powder as a simple metal material is prone to oxidize, the inclusion of oxygen can be reduced by using an Fe—Pt alloy powder or an Fe—Pt atomized powder, and it is effective to use the foregoing alloy powder or atomized powder in order to increase the conductivity and purity of the target.

In addition, the foregoing powders are weighed to achieve the intended composition, and mixed and simultaneously pulverized by using a medium agitation mill, a ball mill, a mortar and the like. However, if the powders are excessively pulverized, the C powder will become fine and prone to aggregate and, therefore, the grain size of the C powder should be, at minimum, 0.1 μm. When metal powders such as of B, Ru, Ag, Au, and Cu or inorganic substance materials such as oxides, nitrides, carbides, and carbonitrides are to be added, they may be mixed at this stage.

Subsequently, the obtained mixed powder is filled in a carbon mold, and subject to molding and sintering via hot press performed at a uniaxial pressure. The C phase becomes aligned in a specified direction during this hot press performed at a uniaxial pressure. While the holding temperature during the sintering will depend on the composition of the sputtering target, in many cases it is in a range of 1000 to 1600° C. Moreover, as needed, hot isostatic pressing may be performed to the sintered compact removed from the hot press mold. Hot isostatic pressing is effective for increasing the density of the sintered compact. While the holding temperature during hot isostatic pressing will depend on the composition of the sintered compact, in many cases it is in a range of 1000 to 1600° C. Moreover, the pressure is set to 100 MPa or more.

The thus obtained sintered compact is processed into an intended shape using a lathe in order to prepare the sputtering target of the present invention.

As described above, by mixing flat or tabular raw material powders and performing thereto hot press at a uniaxial pressure, it is possible to produce a sputtering target in which the C phase is dispersed in a manner of being aligned in a specified direction. In addition, the obtained target yields the effect of generating few particles since an abnormal discharge during sputtering can be inhibited.

EXAMPLES

The present invention is now explained in detail with reference to the Examples and Comparative Examples. Note that these Examples are merely illustrative, and the present invention shall in no way be limited thereby. In other words, various modifications and other embodiments are covered by the present invention, and the present invention is limited only by the scope of its claims.

Example 1

As the raw material powders, prepared were an Fe powder having an average grain size of 3 μm, a Pt powder having an average grain size of 3 μm, and a C powder having average grain size of 6 μm. As the C powder, a flaked graphite powder was used.

Subsequently, an alloyed powder having a composition ratio of Fe-50Pt (at. %) was prepared from the Fe powder and the Pt powder, and the obtained Fe—Pt alloy powder was filled in a medium agitation mill having a capacity of 5 liters together with zirconia balls having a diameter of 5 mm as the grinding medium to be subject to pulverization at 300 rpm for 4 hours to obtain a flat alloy powder.

Thereafter, the obtained alloy powder and the C powder were mixed with a mortar to achieve a composition ratio of (Fe-50Pt)-40C (at. %), and the obtained mixed powder was filled in a carbon mold, and subject to hot pressing. The hot press conditions were as follows; namely, vacuum atmosphere, rate of temperature increase of 300° C./hour, holding temperature of 1400° C., and holding time of 2 hours, and a pressure of 30 MPa was applied from the start of temperature increase to the end of holding. After the end of holding, the resultant product was naturally cooled as is in the chamber.

Subsequently, the sintered compact removed from the hot press mold was subject to hot isostatic pressing. The hot isostatic pressing conditions were as follows; namely, rate of temperature increase of 300° C./hour, holding temperature of 1100° C., and holding time of 2 hours, and the Ar gas pressure was gradually increased from the start of temperature increase, and a pressure of 150 MPa was applied during the holding at 1100° C. After the end of holding, the resultant product was naturally cooled as is in the furnace.

Edges of the obtained sintered compact were cut, the plane horizontal to the sputtering surface and the cross section perpendicular to the sputtering surface were polished to observe the structure thereof under an optical microscope. And, an arbitrarily selected location on the structure surface was photographed to obtain structure micrographs having a visual field size of 108 μm×80 μm. The micrographs are shown in FIG. 6 (blackish portion in the structure observation image corresponds to the C phase). In addition, the average thickness of the C phase in the cross section perpendicular to the sputtering surface was measured, and the result was 0.6 μm.

Moreover, an X-ray diffraction device was used to measure the X-ray diffraction intensity of the horizontal plane and the cross section perpendicular to the sputtering surface of the sintered compact. The measurement conditions of the X-ray diffraction device were as follows; namely, device used: UltimaIV protectus manufactured by Rigaku Corporation, tube: Cu, tube voltage: 40 kV, tube current: 30 mA, scanning field (2θ): 10° to 90°, measurement step (2θ): 0.01°, scan speed (2θ): 1°/min., and scan mode: 2θ/θ. Note that the diffraction peak of the graphite (002) plane appeared near 26.38°, the diffraction peak of the Fe—Pt alloy (001) plane appeared near 23.93°, and the diffraction peak of the Fe—Pt alloy (100) plane appeared near 32.98°.

The results are shown in FIG. 9. The X-ray diffraction intensity ratio of the graphite (002) plane (plane horizontal to sputtering surface/cross section perpendicular to sputtering surface) shown in FIG. 9 was 6.45. Moreover, the X-ray diffraction intensity ratio [(001) plane/(100) plane] of the Fe—Pt alloy in the plane horizontal to the sputtering surface was 2.49, and the X-ray diffraction intensity ratio [(001) plane/(100) plane] of the Fe—Pt alloy in the cross section perpendicular to the sputtering surface was 0.50.

Subsequently, the obtained sintered compact was machined with a lathe into a shape having a diameter of 180.0 mm and a thickness of 5.0 mm, thereafter mounted on a magnetron sputtering equipment (C-3010 sputtering system manufactured by Canon Anelva), and subject to sputtering.

The sputtering conditions were as follows; namely, input power of 1 kW and Ar gas pressure of 1.7 Pa, and after performing pre-sputtering at 2 kWhr, film deposition was performed onto a silicon substrate having a 4-inch diameter for 20 seconds. Subsequently, the number of particles having a size of 0.25 μm or more that adhered onto the substrate was measured with a particle counter. The number of particles in this case was 120 particles.

TABLE 1

| | Composition ratio | Metal raw material powder | Carbon raw material powder | Mixing | X-ray diffraction intensity ratio of graphite (002) plane (plane horizontal to sputtering surface/cross section perpendicular to sputtering surface) | X-ray diffraction intensity ratio of Fe—Pt alloy in plane horizontal to sputtering surface ((001) plane/(100) plane) | X-ray diffraction intensity ratio of Fe—Pt alloy in cross section perpendicular to sputtering surface ((001) plane/(100) plane) | Average thickness of C phase in cross section perpendicular to sputtering surface (μm) | Number of particles (particles) |
|---|---|---|---|---|---|---|---|---|---|
| Example 1 | (Fe—50Pt)—40C (at. %) | Fe—Pt alloy powder (flattening) | Flaked graphite, average grain size 6 μm | Mortar | 6.45 | 2.49 | 0.50 | 0.6 | 120 |
| Example 2 | (Fe—50Pt)—40C (at. %) | Fe—Pt alloy powder (flattening) | Flaked graphite, average grain size 15 μm | Mortar | 6.53 | 2.04 | 0.75 | 1.1 | 90 |
| Example 4 | (Fe—10Pt)—10C (at. %) | Fe—Pt alloy powder (flattening) | Flaked graphite, average grain size 15 μm | Mortar | 6.38 | 2.17 | 0.62 | 1.2 | 15 |
| Example 5 | (Fe—42.Pt—5B)—40C (at. %) | Fe—Pt alloy powder (flattening) | Flaked graphite, average grain size 15 μm | Mortar | 6.49 | 2.36 | 0.71 | 1.0 | 82 |
| Example 6 | (Fe—45Pt—10Ag)—60C (at. %) | Fe—Pt alloy powder (flattening) | Flaked graphite, average grain size 15 μm | Mortar | 6.28 | 2.13 | 0.55 | 1.1 | 56 |
| Example 7 | (Fe—49Pt—2Au)—40C (at. %) | Fe—Pt alloy powder (flattening) | Flaked graphite, average grain size 15 μm | Mortar | 6.43 | 2.09 | 0.73 | 1.1 | 49 |
| Example 8 | (Fe—45Pt—10Cu)—40C (at. %) | Fe—Pt alloy powder (flattening) | Flaked graphite, average grain size 15 μm | Mortar | 6.52 | 2.38 | 0.69 | 1.2 | 78 |
| Example 9 | (Fe—60Pt—10Ru)—40C (at. %) | Fe—Pt alloy powder (flattening) | Flaked graphite, average grain size 15 μm | Mortar | 6.28 | 2.28 | 0.65 | 1.2 | 78 |
| Example 10 | (Fe—50Pt)—5SiO₂—25C (mol. %) | Fe—Pt alloy powder (flattening) | Flaked graphite, average grain size 15 μm | Mortar | 6.50 | 2.07 | 0.70 | 1.1 | 14 |
| Example 11 | (Fe—50Pt)—5TiC—25C (mol. %) | Fe—Pt alloy powder (flattening) | Flaked graphite, average grain size 15 μm | Mortar | 6.39 | 2.23 | 0.74 | 1.1 | 38 |
| Example 12 | (Fe—50Pt)—5Si₃N₄—25C (mol. %) | Fe—Pt alloy powder (flattening) | Flaked graphite, average grain size 15 μm | Mortar | 6.13 | 2.07 | 0.62 | 1.2 | 89 |
| Comparative Example 1 | (Fe—50Pt)—40C (at. %) | Fe powder, Pt powder | Acetylene black, average grain size 48 nm | Medium agitation mill 2 hr | 1.07 | 0.99 | 0.79 | 0.2 | 1300 |
| Comparative Example 2 | (Fe—10Pt)—10C (at. %) | Fe powder, Pt powder | Acetylene black, average grain size 48 nm | Medium agitation mill 2 hr | 1.04 | 0.96 | 0.77 | 0.2 | 510 |
| Comparative Example 3 | (Fe—45Pt—10Ag)—60C (at. %) | Fe powder, Pt powder | Acetylene black, average grain size 48 nm | Medium agitation mill 2 hr | 1.13 | 0.97 | 0.76 | 0.2 | 824 |
| Comparative Example 4 | (Fe—50Pt)—5SiO₂—25C (at. %) | Fe powder, Pt powder | Acetylene black, average grain size 48 nm | Medium agitation mill 2 hr | 1.04 | 0.76 | 0.69 | 0.3 | 303 |

Example 2

A sintered compact was prepared under the same conditions as Example 1 other than that, as the C powder, a flaked graphite powder having an average grain size of 15 μm was used. The micrographs of this sintered compact photographed with an optical microscope are shown in FIG. 7 (blackish portion in the structure observation image corresponds to the C phase). In addition, the average thickness of the C phase in the cross section perpendicular to the sputtering surface was measured, and the result was 1.1 μm. Subsequently, as a result of measuring the X-ray diffraction intensity of the horizontal plane and the cross section perpendicular to the sputtering surface of the sintered compact, the X-ray diffraction intensity ratio of the graphite (002) plane (plane horizontal to sputtering surface/cross section perpendicular to sputtering surface) shown in FIG. 11 was 6.53. Moreover, the X-ray diffraction intensity ratio [(001) plane/(100) plane] of the Fe—Pt alloy in the plane horizontal to the sputtering surface was 2.04, and the X-ray diffraction intensity ratio [(001) plane/(100) plane] of the Fe—Pt alloy in the cross section perpendicular to the sputtering surface was 0.75. This sintered compact was processed into a predetermined shape, and thereafter subject to sputtering under the same conditions as Example 1, and the number of particles that adhered onto the substrate was measured. Consequently, the number of particles was 90 particles.

As the raw material powders, prepared were an Fe powder having an average grain size of 3 μm, a Pt powder having an average grain size of 3 μm, and a C powder having average grain size of 15 μm. As the C powder, a flaked graphite powder was used.

Subsequently, an alloyed powder having a composition ratio of Fe-10Pt (at. %) was prepared from the Fe powder and the Pt powder, and the obtained Fe—Pt alloy powder was filled in a medium agitation mill having a capacity of 5 liters together with zirconia balls having a diameter of 5 mm as the grinding medium to be subject to pulverization at 300 rpm for 4 hours to obtain a flat alloy powder.

Thereafter, the obtained alloy powder and the C powder were mixed with a mortar to achieve a composition ratio of (Fe-10Pt)-10C (at. %), and the obtained mixed powder was filled in a carbon mold, and subject to hot pressing. Other than the foregoing points, a sintered compact was prepared under the same conditions as Example 1. Then, the average thickness of the C phase in the cross section perpendicular to the sputtering surface was measured, and the result was 1.2 μm. Subsequently, as a result of measuring the X-ray diffraction intensity of the horizontal plane and the cross section perpendicular to the sputtering surface of the sintered compact, the X-ray diffraction intensity ratio of the graphite (002) plane (plane horizontal to sputtering surface/ cross section perpendicular to sputtering surface) was 6.38. Moreover, the X-ray diffraction intensity ratio [(001) plane/ (100) plane] of the Fe—Pt alloy in the plane horizontal to the sputtering surface was 2.17, and the X-ray diffraction intensity ratio [(001) plane/(100) plane] of the Fe—Pt alloy in the cross section perpendicular to the sputtering surface was 0.62. This sintered compact was processed into a predetermined shape, and thereafter subject to sputtering under the same conditions as Example 1, and the number of particles that adhered onto the substrate was measured. Consequently, the number of particles was 15 particles.

Example 5

As the raw material powders, prepared were an Fe powder having an average grain size of 3 μm, a Pt powder having an average grain size of 3 μm, an $Fe_2B$ powder having an average grain size of 10 μm, and a C powder having average grain size of 15 μm. As the C powder, a flaked graphite powder was used.

Subsequently, an alloyed powder having a composition ratio of Fe-50Pt (at. %) was prepared from the Fe powder and the Pt powder, and the obtained Fe—Pt alloy powder was filled in a medium agitation mill having a capacity of 5 liters together with zirconia balls having a diameter of 5 mm as the grinding medium to be subject to pulverization at 300 rpm for 4 hours to obtain a flat alloy powder.

Thereafter, the obtained alloy powder, the $Fe_2B$ powder and the C powder were mixed with a mortar to achieve a composition ratio of (Fe-42.5Pt-5B)-40C (at. %), and the obtained mixed powder was filled in a carbon mold, and subject to hot pressing. The holding temperature of the hot press was 1300° C., and the holding temperature of the hot isostatic pressing was 1100° C. Other than the foregoing points, a sintered compact was prepared under the same conditions as Example 1. Then, the average thickness of the C phase in the cross section perpendicular to the sputtering surface was measured, and the result was 1.0 μm. Subsequently, as a result of measuring the X-ray diffraction intensity of the horizontal plane and the cross section perpendicular to the sputtering surface of the sintered compact, the X-ray diffraction intensity ratio of the graphite (002) plane (plane horizontal to sputtering surface/cross section perpendicular to sputtering surface) was 6.49. Moreover, the X-ray diffraction intensity ratio [(001) plane/(100) plane] of the Fe—Pt alloy in the plane horizontal to the sputtering surface was 2.36, and the X-ray diffraction intensity ratio [(001) plane/(100) plane] of the Fe—Pt alloy in the cross section perpendicular to the sputtering surface was 0.71. This sintered compact was processed into a predetermined shape, and thereafter subject to sputtering under the same conditions as Example 1, and the number of particles that adhered onto the substrate was measured. Consequently, the number of particles was 82 particles.

Example 6

As the raw material powders, prepared were an Fe powder having an average grain size of 3 μm, a Pt powder having an average grain size of 3 μm, a Ag powder having an average grain size of 5 μm, and a C powder having average grain size of 15 μm. As the C powder, a flaked graphite powder was used.

Subsequently, an alloyed powder having a composition ratio of Fe-50Pt (at. %) was prepared from the Fe powder and the Pt powder, and the obtained Fe—Pt alloy powder was filled in a medium agitation mill having a capacity of 5 liters together with zirconia balls having a diameter of 5 mm as the grinding medium to be subject to pulverization at 300 rpm for 4 hours to obtain a flat alloy powder.

Thereafter, the obtained alloy powder, the Ag powder and the C powder were mixed with a mortar to achieve a composition ratio of (Fe-45PC-10Ag)-60C (at. %), and the obtained mixed powder was filled in a carbon mold, and subject to hot pressing. The holding temperature of the hot press was 950° C., and the holding temperature of the hot isostatic pressing was 950° C. Other than the foregoing points, a sintered compact was prepared under the same conditions as Example 1. Then, the average thickness of the C phase in the cross section perpendicular to the sputtering surface was measured, and the result was 1.1 μm. Subsequently, as a result of measuring the X-ray diffraction intensity of the horizontal plane and the cross section perpendicular to the sputtering surface of the sintered compact, the X-ray diffraction intensity ratio of the graphite (002) plane (plane horizontal to sputtering surface/cross section perpendicular to sputtering surface) was 6.28. Moreover, the X-ray diffraction intensity ratio [(001) plane/(100) plane] of the Fe—Pt alloy in the plane horizontal to the sputtering surface was 2.13, and the X-ray diffraction intensity ratio [(001) plane/(100) plane] of the Fe—Pt alloy in the cross section perpendicular to the sputtering surface was 0.55. This sintered compact was processed into a predetermined shape, and thereafter subject to sputtering under the same conditions as Example 1, and the number of particles that adhered onto the substrate was measured. Consequently, the number of particles was 56 particles.

Example 7

As the raw material powders, prepared were an Fe powder having an average grain size of 3 μm, a Pt powder having an average grain size of 3 μm, a Au powder having an average grain size of 5 μm, and a C powder having average grain size of 15 μm. As the C powder, a flaked graphite powder was used.

Subsequently, an alloyed powder having a composition ratio of Fe-50Pt (at. %) was prepared from the Fe powder and the Pt powder, and the obtained Fe—Pt alloy powder was filled in a medium agitation mill having a capacity of 5 liters together with zirconia balls having a diameter of 5 mm as the grinding medium to be subject to pulverization at 300 rpm for 4 hours to obtain a flat alloy powder.

Thereafter, the obtained alloy powder, the Au powder and the C powder were mixed with a mortar to achieve a composition ratio of (Fe-49Pt-2Au)-40C (at. %), and the obtained mixed powder was filled in a carbon mold, and subject to hot pressing. The holding temperature of the hot press was 1050° C., and the holding temperature of the hot isostatic pressing was 950° C. Other than the foregoing points, a sintered compact was prepared under the same conditions as Example 1. Then, the average thickness of the C phase in the cross section perpendicular to the sputtering surface was measured, and the result was 1.1 μm. Subsequently, as a result of measuring the X-ray diffraction intensity of the horizontal plane and the cross section perpendicular to the sputtering surface of the sintered compact, the X-ray diffraction intensity ratio of the graphite (002) plane (plane horizontal to sputtering surface/cross section perpendicular to sputtering surface) was 6.43. Moreover, the X-ray diffraction intensity ratio [(001) plane/(100) plane] of the Fe—Pt alloy in the plane horizontal to the sputtering surface was 2.09, and the X-ray diffraction intensity ratio [(001) plane/(100) plane] of the Fe—Pt alloy in the cross section perpendicular to the sputtering surface was 0.73. This sintered compact was processed into a predetermined shape, and thereafter subject to sputtering under the same conditions as Example 1, and the number of particles that adhered onto the substrate was measured. Consequently, the number of particles was 49 particles.

Example 8

As the raw material powders, prepared were an Fe powder having an average grain size of 3 μm, a Pt powder having an average grain size of 3 μm, a Cu powder having an average grain size of 5 μm, and a C powder having average grain size of 15 μm. As the C powder, a flaked graphite powder was used.

Subsequently, an alloyed powder having a composition ratio of Fe-50Pt (at. %) was prepared from the Fe powder and the Pt powder, and the obtained Fe—Pt alloy powder was filled in a medium agitation mill having a capacity of 5 liters together with zirconia balls having a diameter of 5 mm as the grinding medium to be subject to pulverization at 300 rpm for 4 hours to obtain a flat alloy powder.

Thereafter, the obtained alloy powder, the Cu powder and the C powder were mixed with a mortar to achieve a composition ratio of (Fe-45Pt-10Cu)-40C (at. %), and the obtained mixed powder was filled in a carbon mold, and subject to hot pressing. The holding temperature of the hot press was 1060° C., and the holding temperature of the hot isostatic pressing was 1100° C. Other than the foregoing points, a sintered compact was prepared under the same conditions as Example 1. Then, the average thickness of the C phase in the cross section perpendicular to the sputtering surface was measured, and the result was 1.2 μm. Subsequently, as a result of measuring the X-ray diffraction intensity of the horizontal plane and the cross section perpendicular to the sputtering surface of the sintered compact, the X-ray diffraction intensity ratio of the graphite (002) plane (plane horizontal to sputtering surface/cross section perpendicular to sputtering surface) was 6.52. Moreover, the X-ray diffraction intensity ratio [(001) plane/(100) plane] of the Fe—Pt alloy in the plane horizontal to the sputtering surface was 2.38, and the X-ray diffraction intensity ratio [(001) plane/(100) plane] of the Fe—Pt alloy in the cross section perpendicular to the sputtering surface was 0.69. This sintered compact was processed into a predetermined shape, and thereafter subject to sputtering under the same conditions as Example 1, and the number of particles that adhered onto the substrate was measured. Consequently, the number of particles was 78 particles.

Example 9

As the raw material powders, prepared were an Fe powder having an average grain size of 3 μm, a Pt powder having an average grain size of 3 μm, a Ru powder having an average grain size of 5 μm, and a C powder having average grain size of 15 μm. As the C powder, a flaked graphite powder was used.

Subsequently, an alloyed powder having a composition ratio of Fe-66.7Pt (at. %) was prepared from the Fe powder and the Pt powder, and the obtained Fe—Pt alloy powder was filled in a medium agitation mill having a capacity of 5 liters together with zirconia balls having a diameter of 5 mm as the grinding medium to be subject to pulverization at 300 rpm for 4 hours to obtain a flat alloy powder.

Thereafter, the obtained alloy powder, the Ru powder and the C powder were mixed with a mortar to achieve a composition ratio of (Fe-60Pt-10Ru)-40C (at. %), and the obtained mixed powder was filled in a carbon mold, and subject to hot pressing. The holding temperature of the hot press was 1400° C., and the holding temperature of the hot isostatic pressing was 1100° C. Other than the foregoing points, a sintered compact was prepared under the same conditions as Example 1. Then, the average thickness of the C phase in the cross section perpendicular to the sputtering surface was measured, and the result was 1.2 μm. Subsequently, as a result of measuring the X-ray diffraction intensity of the horizontal plane and the cross section perpendicular to the sputtering surface of the sintered compact, the X-ray diffraction intensity ratio of the graphite (002) plane (plane horizontal to sputtering surface/cross section perpendicular to sputtering surface) was 6.28. Moreover, the X-ray diffraction intensity ratio [(001) plane/(100) plane] of the Fe—Pt alloy in the plane horizontal to the sputtering surface was 2.28, and the X-ray diffraction intensity ratio [(001) plane/(100) plane] of the Fe—Pt alloy in the cross section perpendicular to the sputtering surface was 0.65. This sintered compact was processed into a predetermined shape, and thereafter subject to sputtering under the same conditions as Example 1, and the number of particles that adhered onto the substrate was measured. Consequently, the number of particles was 78 particles.

Example 10

As the raw material powders, prepared were an Fe powder having an average grain size of 3 μm, a Pt powder having an average grain size of 3 μm, a SiO$_2$ powder having an average grain size of 1 μm, and a C powder having average grain size of 15 μm. As the C powder, a flaked graphite powder was used.

Subsequently, an alloyed powder having a composition ratio of Fe-50Pt (at. %) was prepared from the Fe powder and the Pt powder, and the obtained Fe—Pt alloy powder was filled in a medium agitation mill having a capacity of 5 liters together with zirconia balls having a diameter of 5 mm as the grinding medium to be subject to pulverization at 300 rpm for 4 hours to obtain a flat alloy powder.

Thereafter, the obtained alloy powder, the Fe—B powder, the SiO$_2$ powder and the C powder were mixed with a mortar to achieve a composition ratio of (Fe-50Pt)-5SiO$_2$-25C (at. %), and the obtained mixed powder was filled in a carbon mold, and subject to hot pressing. The holding temperature of the hot press was 1100° C., and the holding temperature of the hot isostatic pressing was 1100° C. Other than the foregoing points, a sintered compact was prepared under the same conditions as Example 1. Then, the average thickness of the C phase in the cross section perpendicular to the sputtering surface was measured, and the result was 1.1 μm. Subsequently, as a result of measuring the X-ray diffraction intensity of the horizontal plane and the cross section perpendicular to the sputtering surface of the sintered compact, the X-ray diffraction intensity ratio of the graphite (002) plane (plane horizontal to sputtering surface/cross section perpendicular to sputtering surface) was 6.50. Moreover, the X-ray diffraction intensity ratio [(001) plane/(100) plane] of the Fe—Pt alloy in the plane horizontal to the sputtering surface was 2.07, and the X-ray diffraction intensity ratio [(001) plane/(100) plane] of the Fe—Pt alloy in the cross section perpendicular to the sputtering surface was 0.70. This sintered compact was processed into a predetermined shape, and thereafter subject to sputtering under the same conditions as Example 1, and the number of particles that adhered onto the substrate was measured. Consequently, the number of particles was 14 particles.

Example 11

As the raw material powders, prepared were an Fe powder having an average grain size of 3 μm, a Pt powder having an average grain size of 3 μm, a TiC powder having an average grain size of 50 μm, and a C powder having average grain size of 15 μm. As the C powder, a flaked graphite powder was used.

Subsequently, an alloyed powder having a composition ratio of Fe-50Pt (at. %) was prepared from the Fe powder and the Pt powder, and the obtained Fe—Pt alloy powder was filled in a medium agitation mill having a capacity of 5 liters together with zirconia balls having a diameter of 5 mm as the grinding medium to be subject to pulverization at 300 rpm for 4 hours to obtain a flat alloy powder.

Thereafter, the obtained alloy powder, the TiC powder and the C powder were mixed with a mortar to achieve a composition ratio of (Fe-50Pt)-5TiC-25C (at. %), and the obtained mixed powder was filled in a carbon mold, and subject to hot pressing. The holding temperature of the hot press was 1400° C., and the holding temperature of the hot isostatic pressing was 1100° C. Other than the foregoing points, a sintered compact was prepared under the same conditions as Example 1. Then, the average thickness of the C phase in the cross section perpendicular to the sputtering surface was measured, and the result was 1.1 μm. Subsequently, as a result of measuring the X-ray diffraction intensity of the horizontal plane and the cross section perpendicular to the sputtering surface of the sintered compact, the X-ray diffraction intensity ratio of the graphite (002) plane (plane horizontal to sputtering surface/cross section perpendicular to sputtering surface) was 6.39. Moreover, the X-ray diffraction intensity ratio [(001) plane/(100) plane] of the Fe—Pt alloy in the plane horizontal to the sputtering surface was 2.23, and the X-ray diffraction intensity ratio [(001) plane/(100) plane] of the Fe—Pt alloy in the cross section perpendicular to the sputtering surface was 0.74. This sintered compact was processed into a predetermined shape, and thereafter subject to sputtering under the same conditions as Example 1, and the number of particles that adhered onto the substrate was measured. Consequently, the number of particles was 38 particles.

Example 12

As the raw material powders, prepared were an Fe powder having an average grain size of 3 μm, a Pt powder having an average grain size of 3 μm, a Si$_3$N$_4$ powder having an average grain size of 50 μm, and a C powder having average grain size of 15 μm. As the C powder, a flaked graphite powder was used.

Subsequently, an alloyed powder having a composition ratio of Fe-50Pt (at. %) was prepared from the Fe powder and the Pt powder, and the obtained Fe—Pt alloy powder was filled in a medium agitation mill having a capacity of 5 liters together with zirconia balls having a diameter of 5 mm as the grinding medium to be subject to pulverization at 300 rpm for 4 hours to obtain a flat alloy powder.

Thereafter, the obtained alloy powder, the SiN powder and the C powder were mixed with a mortar to achieve a composition ratio of (Fe-50Pt)-5Si$_3$N$_4$-25C (at %), and the obtained mixed powder was filled in a carbon mold, and subject to hot pressing. The holding temperature of the hot press was 1400° C., and the holding temperature of the hot isostatic pressing was 1100° C. Other than the foregoing points, a sintered compact was prepared under the same conditions as Example 1. Then, the average thickness of the C phase in the cross section perpendicular to the sputtering surface was measured, and the result was 12 μm. Subsequently, as a result of measuring the X-ray diffraction intensity of the horizontal plane and the cross section perpendicular to the sputtering surface of the sintered compact, the X-ray diffraction intensity ratio of the graphite (002) plane (plane horizontal to sputtering surface/cross section perpendicular to sputtering surface) was 6.13. Moreover, the X-ray diffraction intensity ratio [(001) plane/(100) plane] of the Fe—Pt alloy in the plane horizontal to the sputtering surface was 2.07, and the X-ray diffraction intensity ratio [(001) plane/(100) plane] of the Fe—Pt alloy in the cross section perpendicular to the sputtering surface was 0.62. This sintered compact was processed into a predetermined shape, and thereafter subject to sputtering under the same conditions as Example 1, and the number of particles that adhered onto the substrate was measured. Consequently, the number of particles was 89 particles.

Comparative Example 1

As the raw material powders, prepared were an Fe powder having an average grain size of 3 µm, a Pt powder having an average grain size of 3 µm, and a C powder having average grain size of 48 nm. As the C powder, an acetylene black powder was used.

Subsequently, in order to achieve a composition ratio of (Fe-50Pt)-40C (at. %), the Fe powder, the Pt powder and the C powder were filled in a medium agitation mill having a capacity of 5 liters together with zirconia balls having a diameter of 5 mm as the grinding medium to be subject to pulverization for 2 hours, and the obtained mixed powder was filled in a carbon mold, and subject to hot pressing. The hot press conditions were as follows; namely, vacuum atmosphere, rate of temperature increase of 300° C./hour, holding temperature of 1400° C., and holding time of 2 hours, and a pressure of 30 MPa was applied from the start of temperature increase to the end of holding. After the end of holding, the resultant product was naturally cooled as is in the chamber.

Subsequently, the sintered compact removed from the hot press mold was subject to hot isostatic pressing. The hot isostatic pressing conditions were as follows; namely, rate of temperature increase of 300° C./hour, holding temperature of 1100° C., and holding time of 2 hours, and the Ar gas pressure was gradually increased from the start of temperature increase, and a pressure of 150 MPa was applied during the holding at 1100° C. After the end of holding, the resultant product was naturally cooled as is in the furnace.

Edges of the obtained sintered compact were cut, the plane horizontal to the sputtering surface and the cross section perpendicular to the sputtering surface were polished to observe the structure thereof under an optical microscope. And, an arbitrarily selected location on the structure surface was photographed to obtain structure micrographs having a visual field size of 108 µm×80 µm. The micrographs are shown in FIG. 8 (blackish portion in the structure observation image corresponds to the C phase). In addition, the average thickness of the C phase in the cross section perpendicular to the sputtering surface was measured, and the result was 0.2 µm.

Figure 11:
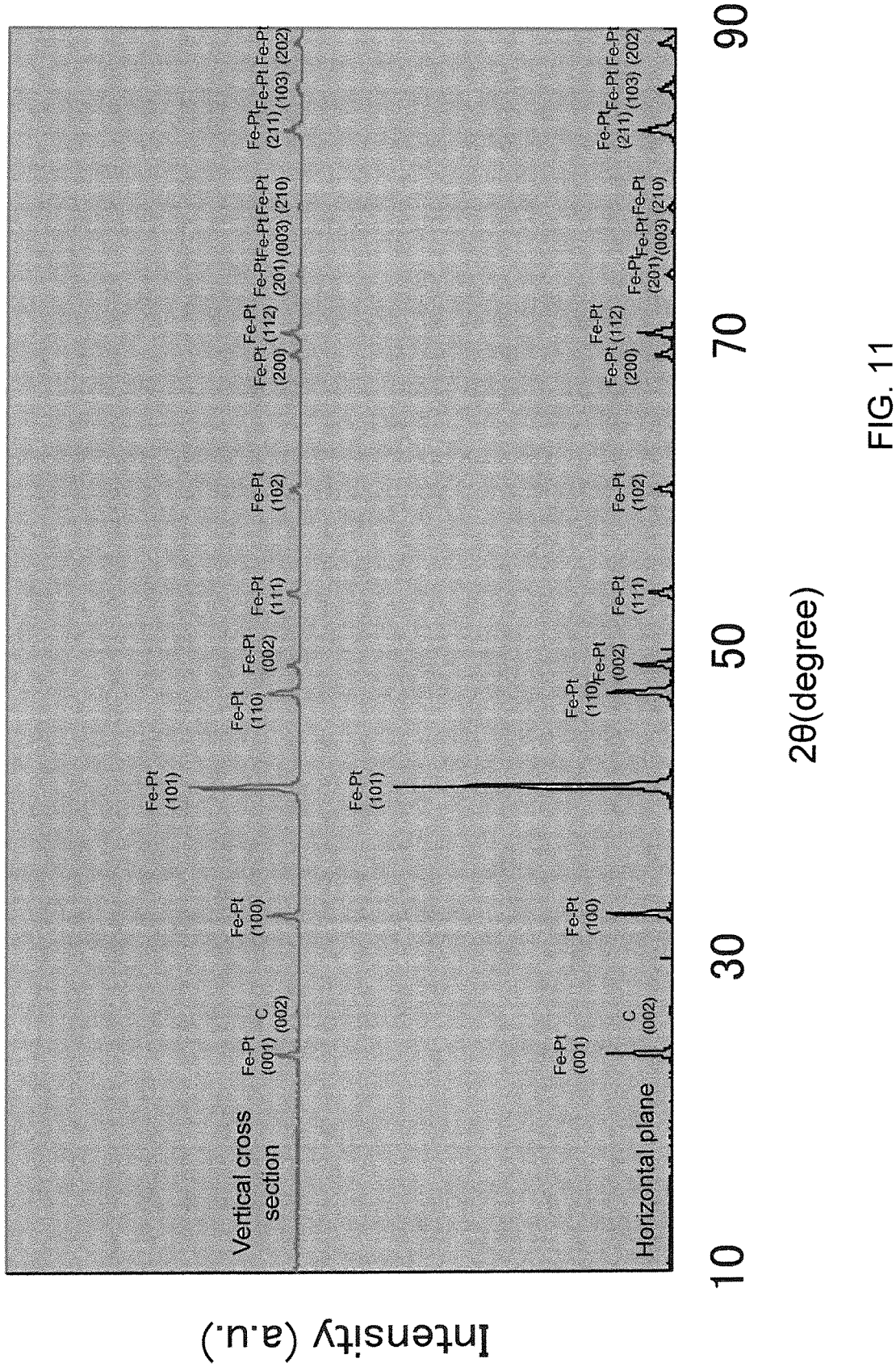
FIG. 11 This shows the ratio of X-ray diffraction peak intensity of the target of Comparative Example 1 (plane horizontal to a sputtering surface: lower row; cross section perpendicular to sputtering surface: upper row).

Moreover, under the same conditions as Example 1, an X-ray diffraction device was used to measure the X-ray diffraction intensity of the horizontal plane and the cross section perpendicular to the sputtering surface of the sintered compact. The results are shown in FIG. 11. The X-ray diffraction intensity ratio of the graphite (002) plane (plane horizontal to sputtering surface/cross section perpendicular to sputtering surface) shown in FIG. 11 was 1.07. Moreover, the X-ray diffraction intensity ratio [(001) plane/(100) plane] of the Fe—Pt alloy in the plane horizontal to the sputtering surface was 0.99, and the X-ray diffraction intensity ratio [(001) plane/(100) plane] of the Fe—Pt alloy in the cross section perpendicular to the sputtering surface was 0.79.

Subsequently, the obtained sintered compact was machined with a lathe into a shape having a diameter of 180.0 mm and a thickness of 5.0 mm, thereafter mounted on a magnetron sputtering equipment (C-3010 sputtering system manufactured by Canon Anelva), and subject to sputtering.

The sputtering conditions were as follows; namely, input power of 1 kW and Ar gas pressure of 1.7 Pa, and after performing pre-sputtering at 2 kWhr, film deposition was performed onto an aluminum substrate having a 3.5-inch diameter for 20 seconds. Subsequently, the number of particles that adhered onto the substrate was measured with a particle counter. The number of particles in this case was 1300 particles.

Comparative Example 2

As the raw material powders, prepared were an Fe powder having an average grain size of 3 µm, a Pt powder having an average grain size of 3 µm, and a C powder having average grain size of 48 nm. As the C powder, an acetylene black powder was used.

Subsequently, in order to achieve a composition ratio of (Fe-10Pt)-10C (at. %), the Fe powder, the Pt powder and the C powder were filled in a medium agitation mill having a capacity of 5 liters together with zirconia balls having a diameter of 5 mm as the grinding medium to be subject to pulverization for 2 hours, and the obtained mixed powder was filled in a carbon mold, and subject to hot pressing. Other than the foregoing points, a sintered compact was prepared under the same conditions as Comparative Example 1. Then, the average thickness of the C phase in the cross section perpendicular to the sputtering surface was measured, and the result was 0.2 µm. Subsequently, as a result of measuring the X-ray diffraction intensity of the horizontal plane and the cross section perpendicular to the sputtering surface of the sintered compact, the X-ray diffraction intensity ratio of the graphite (002) plane (plane horizontal to sputtering surface/cross section perpendicular to sputtering surface) was 1.04. Moreover, the X-ray diffraction intensity ratio [(001) plane/(100) plane] of the Fe—Pt alloy in the plane horizontal to the sputtering surface was 0.96, and the X-ray diffraction intensity ratio [(001) plane/(100) plane] of the Fe—Pt alloy in the cross section perpendicular to the sputtering surface was 0.77. The obtained sintered compact was processed into a predetermined shape, and thereafter subject to sputtering under the same conditions as Comparative Example 1, and the number of particles that adhered onto the substrate was measured. Consequently, the number of particles was 510 particles.

Comparative Example 3

As the raw material powders, prepared were an Fe powder having an average grain size of 3 µm, a Pt powder having an average grain size of 3 µm, a Ag powder having an average grain size of 5 µm, and a C powder having average grain size of 48 nm. As the C powder, an acetylene black powder was used.

Subsequently, in order to achieve a composition ratio of (Fe-45Pt-10Ag)-60C (at. %), the Fe powder, the Pt powder, the Ag powder and the C powder were filled in a medium agitation mill having a capacity of 5 liters together with zirconia balls having a diameter of 5 mm as the grinding medium to be subject to pulverization for 2 hours, and the obtained mixed powder was filled in a carbon mold, and subject to hot pressing. The holding temperature of the hot press was 950° C., and the holding temperature of the hot isostatic pressing was 950° C. Other than the foregoing points, a sintered compact was prepared under the same conditions as Comparative Example 1. Then, the average thickness of the C phase in the cross section perpendicular to the sputtering surface was measured, and the result was 0.2 µm. Subsequently, as a result of measuring the X-ray diffraction intensity of the horizontal plane and the cross section perpendicular to the sputtering surface of the sintered compact, the X-ray diffraction intensity ratio of the graphite (002) plane (plane horizontal to sputtering surface/cross section perpendicular to sputtering surface) was 1.13. Moreover, the X-ray diffraction intensity ratio [(001) plane/(100) plane] of the Fe—Pt alloy in the plane horizontal to the sputtering surface was 0.97, and the X-ray diffraction intensity ratio [(001) plane/(100) plane] of the Fe—Pt alloy in the cross section perpendicular to the sputtering surface was 0.76. The obtained sintered compact was processed into a predetermined shape, and thereafter subject to sputtering under the same conditions as Comparative Example 1, and the number of particles that adhered onto the substrate was measured. Consequently, the number of particles was 824 particles.

Comparative Example 4

As the raw material powders, prepared were an Fe powder having an average grain size of 3 µm, a Pt powder having an average grain size of 3 µm, a $SiO_2$ powder having an average grain size of 1 µm, and a C powder having average grain size of 48 nm. As the C powder, an acetylene black powder was used.

Subsequently, in order to achieve a composition ratio of (Fe-50Pt)-5$SiO_2$-25C (at. %), the Fe powder, the Pt powder, the $SiO_2$ powder and the C powder were filled in a medium agitation mill having a capacity of 5 liters together with zirconia balls having a diameter of 5 mm as the grinding medium to be subject to pulverization for 2 hours, and the obtained mixed powder was filled in a carbon mold, and subject to hot pressing. The holding temperature of the hot press was 1100° C., and the holding temperature of the hot isostatic pressing was 1100° C. Other than the foregoing points, a sintered compact was prepared under the same conditions as Comparative Example 1. Then, the average thickness of the C phase in the cross section perpendicular to the sputtering surface was measured, and the result was 0.3 µm. Subsequently, as a result of measuring the X-ray diffraction intensity of the horizontal plane and the cross section perpendicular to the sputtering surface of the sintered compact, the X-ray diffraction intensity ratio of the graphite (002) plane (plane horizontal to sputtering surface/cross section perpendicular to sputtering surface) was 1.04. Moreover, the X-ray diffraction intensity ratio [(001) plane/(100) plane] of the Fe—Pt alloy in the plane horizontal to the sputtering surface was 0.76, and the X-ray diffraction intensity ratio [(001) plane/(100) plane] of the Fe—Pt alloy in the cross section perpendicular to the sputtering surface was 0.69. The obtained sintered compact was processed into a predetermined shape, and thereafter subject to sputtering under the same conditions as Comparative Example 1, and the number of particles that adhered onto the substrate was measured. Consequently, the number of particles was 303 particles.

Figure 10:
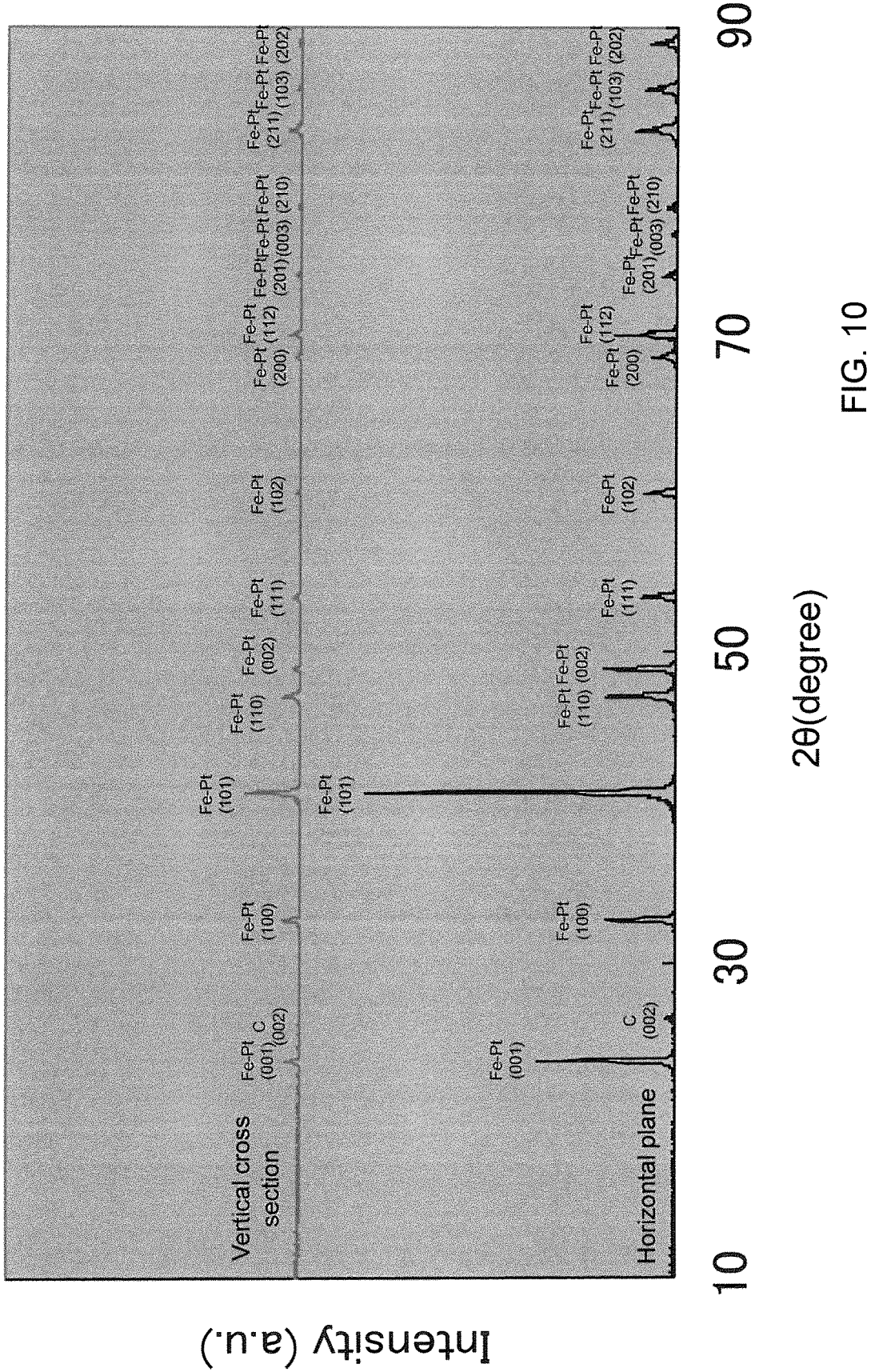
FIG. 10 This shows the ratio of X-ray diffraction peak intensity of the target of Example 2 (plane horizontal to a sputtering surface: lower row; cross section perpendicular to sputtering surface: upper row).

The foregoing results are summarized in Table 1. As shown in Table 1, as to the sputtering targets in any of the Examples of the present invention, the C phase in a sputtering target is dispersed in a manner of being aligned in a specified direction, and thereby the particles that are generated during sputtering were constantly fewer in comparison to the Comparative Examples. Moreover, FIG. 9 to FIG. 11 show the X-ray diffraction intensity profiles of Example 1 to Example 2 and Comparative Example 1. As shown in FIG. 9 and FIG. 10, based on the X-ray diffraction intensity ratio of the graphite (002) plane (plane horizontal to sputtering surface/cross section perpendicular to sputtering surface), it can be seen that the flat or tabular C phase is dispersed horizontally relative to the horizontal plane.

The foregoing magnetic recording layer is configured from a magnetic phase such as an Fe—Pt alloy, and a nonmagnetic phase that separates the magnetic phase, and provided is a ferromagnetic material sputtering target in which carbon is used as a nonmagnetic phase material. The ferromagnetic material sputtering target of the present invention yields superior effects in that, when sputtered, the ferromagnetic material sputtering target is effective in preventing the generation of particles caused by an abnormal discharge originating from carbon, which is prone to aggregate. Accordingly, the present invention is useful as a ferromagnetic material sputtering target for depositing a magnetic thin film, particularly a granular-type magnetic recording layer, of a magnetic recording medium.

The invention claimed is:

1. A sputtering target comprising an Fe—Pt system sintered alloy containing C for forming a magnetic recording film, having a composition consisting of C in an amount of 10 mol % or more and 70 mol % or less, Pt in an amount of 5 mol % or more and 60 mol % or less, one or more elements selected from the group consisting of B, Ru, Ag, Au, and Cu in a total amount of 0.5 mol % or more and 10 mol % or less, one or more materials selected from the group consisting of oxides, nitrides, carbides, and carbonitrides, and a remainder being Fe and unavoidable impurities, and having a sintered structure containing a dispersion of particles of a graphite phase having a flat or tabular shape with an average thickness of 10 µm or less in a cross section perpendicular to a sputtering face of the sputtering target and originating from a flaked graphite powder as a raw material, wherein the sputtering target has a ratio (X/Y) of 2 or more for an intensity (X) of an X-ray diffraction peak of a (002) plane of the graphite phase measured in a cross section of the sputtering target parallel to the sputtering face of the sputtering target and an intensity (Y) of an X-ray diffraction peak of a (002) plane of the graphite phase measured in a cross section of the sputtering target perpendicular to the sputtering face.

2. The sputtering target according to claim 1, wherein the sputtering target has a ratio ($Y_{001}/Y_{100}$) of 1.0 or less for an intensity ($Y_{001}$) of an X-ray diffraction peak of a (001) plane of the Fe—Pt system sintered alloy measured in the cross section of the sputtering target perpendicular to the sputtering face and an intensity ($Y_{100}$) of an X-ray diffraction peak of a (100) plane of the Fe—Pt system sintered alloy measured in the cross section of the sputtering target perpendicular to the sputtering face, and wherein the sputtering target has a ratio ($X_{001}/X_{100}$) of 1.0 or more for an intensity ($X_{001}$) of an X-ray diffraction peak of a (001) plane of the Fe—Pt system sintered alloy measured in the cross section parallel to the sputtering face and an intensity ($X_{100}$) of an X-ray diffraction peak of a (100) plane of the Fe—Pt system sintered alloy measured in the cross section parallel to the sputtering face.

3. A method for manufacturing the sputtering target according to claim 1, wherein raw material powders including a flaked graphite powder and a metal or alloy powder are subject together to pulverization and mixing, and are thereafter compacted, and an obtained compact is subject to uniaxial pressure sintering.

4. The method according to claim 3, wherein, before the flaked graphite powder and the metal or alloy powder are subject together to pulverization and mixing, the metal or alloy powder is subject to treatment in a ball mill or agitation mill to provide grains of the metal or alloy powder with a flat or tabular shape.

5. A method of manufacturing the sputtering target according to claim 1, comprising the steps of:

mixing raw material powders including a flaked graphite powder and a metal or alloy powder to produce a composition of C in an amount of 10 mol % or more and 70 mol % or less, Pt in an amount of 5 mol % or more and 60 mol % or less, and Fe;

compacting the raw material powders after said mixing step to produce a compact;

subjecting the compact to uniaxial pressure sintering.

6. The method according to claim 5, further comprising the step of subjecting the metal or alloy powder to treatment in a ball or agitation mill to provide grains of the metal or alloy powder with a flat or tabular shape before said mixing step.

* * * * *